United States Patent [19]

Thouvenin et al.

[11] Patent Number: 4,994,940
[45] Date of Patent: Feb. 19, 1991

[54] MODULAR CABINET FOR ELECTRICAL BATTERY BANKS

[75] Inventors: Jean-Marie Thouvenin; Jean-Pierre Bochard, both of Seyssins; Jacques Doize, Meylan, all of France

[73] Assignee: Merlin Gerin, France

[21] Appl. No.: 412,331

[22] Filed: Sep. 26, 1989

[30] Foreign Application Priority Data

Sep. 29, 1988 [FR] France ............... 8812881

[51] Int. Cl.$^5$ ............................................... H02B 1/01
[52] U.S. Cl. .................................. 361/429; 361/391; 361/396; 361/399; 361/383; 204/297 W
[58] Field of Search ............................... 204/297 W; 361/390–396, 399, 429, 383, 384, 380

[56] References Cited

U.S. PATENT DOCUMENTS

| | | | |
|---|---|---|---|
| 2,173,736 | 9/1939 | Thomas | 175/183 |
| 4,325,799 | 4/1982 | Gordy et al. | 204/297 W |
| 4,597,291 | 7/1986 | Motomiya | 361/395 |

FOREIGN PATENT DOCUMENTS

| | | |
|---|---|---|
| 0085744 | 8/1983 | European Pat. Off. |
| 0181729 | 5/1986 | European Pat. Off. |
| 0281710 | 9/1988 | European Pat. Off. |
| 19161 | 12/1881 | Fed. Rep. of Germany |
| 2344133 | 7/1977 | France |
| 1112812 | 5/1968 | United Kingdom |

Primary Examiner—Gregory D. Thompson
Attorney, Agent, or Firm—Arnold, White & Durkee

[57] ABSTRACT

A modular cabinet including a plurality of battery modules each which can be withdrawn from the cabinet. The frame has a parallelipipedic-shaped metal framework, including a plinth of rectangular cross-section parallel to the different shelves, roller devices fixed to the base of the plinth to provide movement of the module in the depthwise direction between an inserted position and a withdrawn position, a first vertical front flange extending perpendicularly to the plinth, a second rear flange parallel to the first flange and shelves interposed in the depthwise between the flanges. A closed side plate connects the two flanges and the plinth, and a transverse free space is provided between the batteries and the open side face opposite the side plate. Movement of the module in translation to the withdrawn position enables all the batteries to be fully accessed via the open side face.

10 Claims, 7 Drawing Sheets

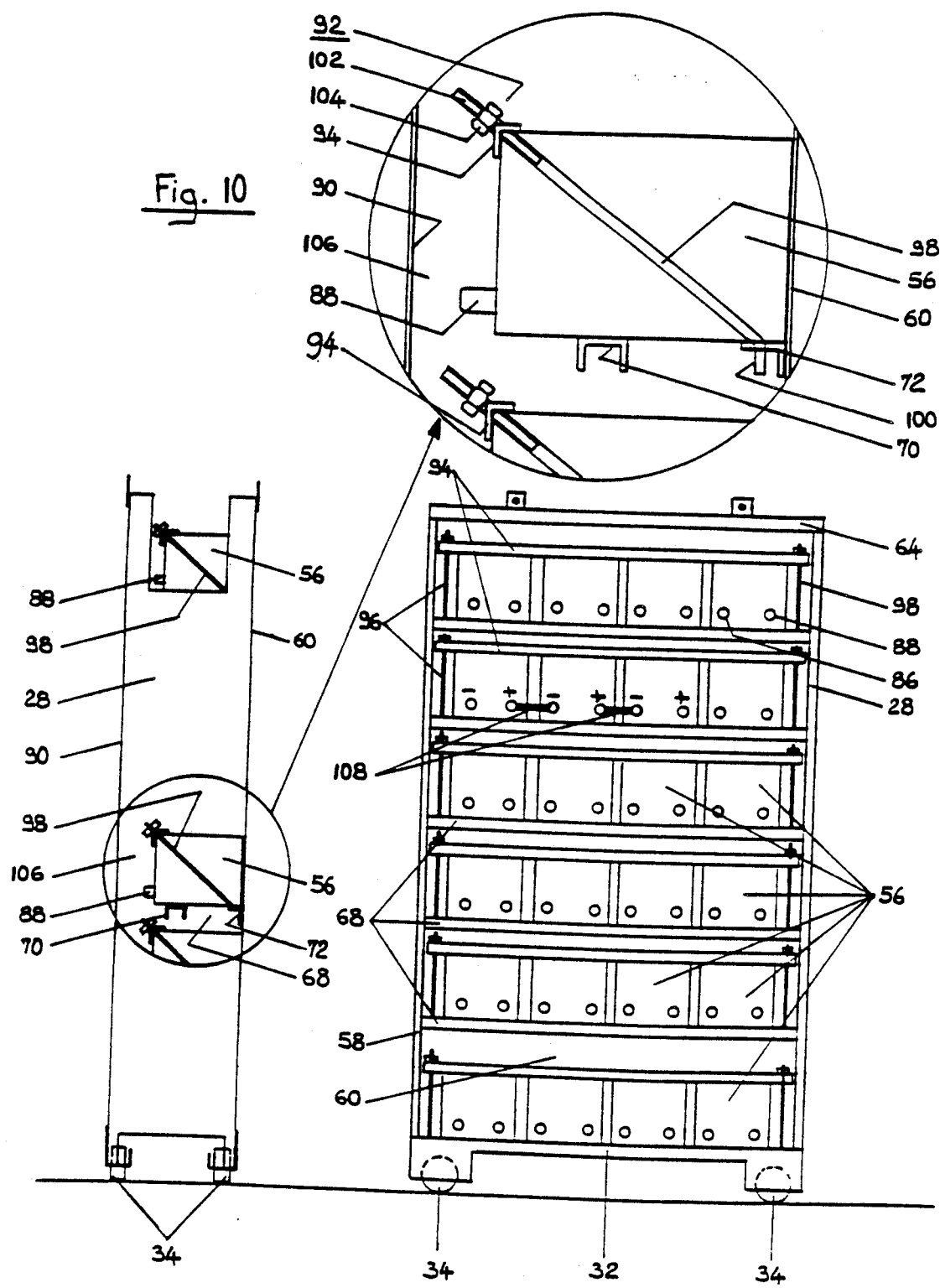

4,994,940

MODULAR CABINET FOR ELECTRICAL BATTERY BANKS

BACKGROUND OF THE INVENTION

The invention relates to a modular cabinet for electrical battery banks, associated notably with an inverter cubicle, and comprising a plurality of battery modules each having a withdrawable frame, equipped with horizontal shelves superposed heightwise to support the batteries.

Arranging the batteries on the shelves of the cabinets generally gives rise to the following problems:

the horizontal arrangement of the shelves is liable to interfere with the airing of the intermediate volume of the cabinet, and it is then indispensable to provide a large ventilation grate surface, notably over the whole height, which can affect the aesthetic appearance of the cabinet;

at least half the number of batteries are difficult to access when maintenance operations are performed.

The object of the invention consists in improving both the accessibility of the batteries inside a battery module cabinet, and the assembly of a module to an inverter cubicle or to another module.

SUMMARY OF THE INVENTION

The frame of the cabinet comprises a first vertical front flange extending perpendicularly to the plinth, a second rear flange parallel to the first flange with shelves interposed in the depthwise direction, and a closed side plate connecting the two flanges and the plinth. The base of the plinth includes roller members to provide movement of the module in the depthwise direction between an inserted position, and a withdrawn position. A transverse free space is arranged between the batteries and the open side face opposite the side plate. When the module is actuated in translation to the withdrawn position, all the batteries are fully accessed via the open side face. The frame is also provided with lateral guiding means arranged to ensure mechanical latching of two modules, or of one module located side by side with the invertor cubicle, and to ensure translation guiding upon movement of the module between the inserted position and the withdrawn position.

Internal ventilation of the modules is achieved via the vertical volume of the free space by judicious arrangement of air inlet and outlet grates.

Movement of a module is achieved by means of fold-back gripping handles fixed to the front flange of the frame.

Each shelf is composed of a support plate securedly united to the two front and rear flanges, and a securing angle-bracket fixed to the side plate in a single horizontal plane.

The wiring between the different rows of the modules is achieved in a standard, modular manner.

BRIEF DESCRIPTION OF THE DRAWINGS

Other advantages and features will become more clearly apparent from the following description of an illustrative embodiment of the invention, given as a non-restrictive example only and represented in the accompanying drawings, in which:

FIG. 8 is a view of a module along the line VIII—VIII of FIG. 5, showing the internal arrangement of the batteries via the open side face of the frame;

FIG. 9 represents a profile view of FIG. 8;

FIG. 10 is a detailed view on an enlarged scale of FIG. 9.

DESCRIPTION OF THE PREFERRED EMBODIMENT

Figure 1:
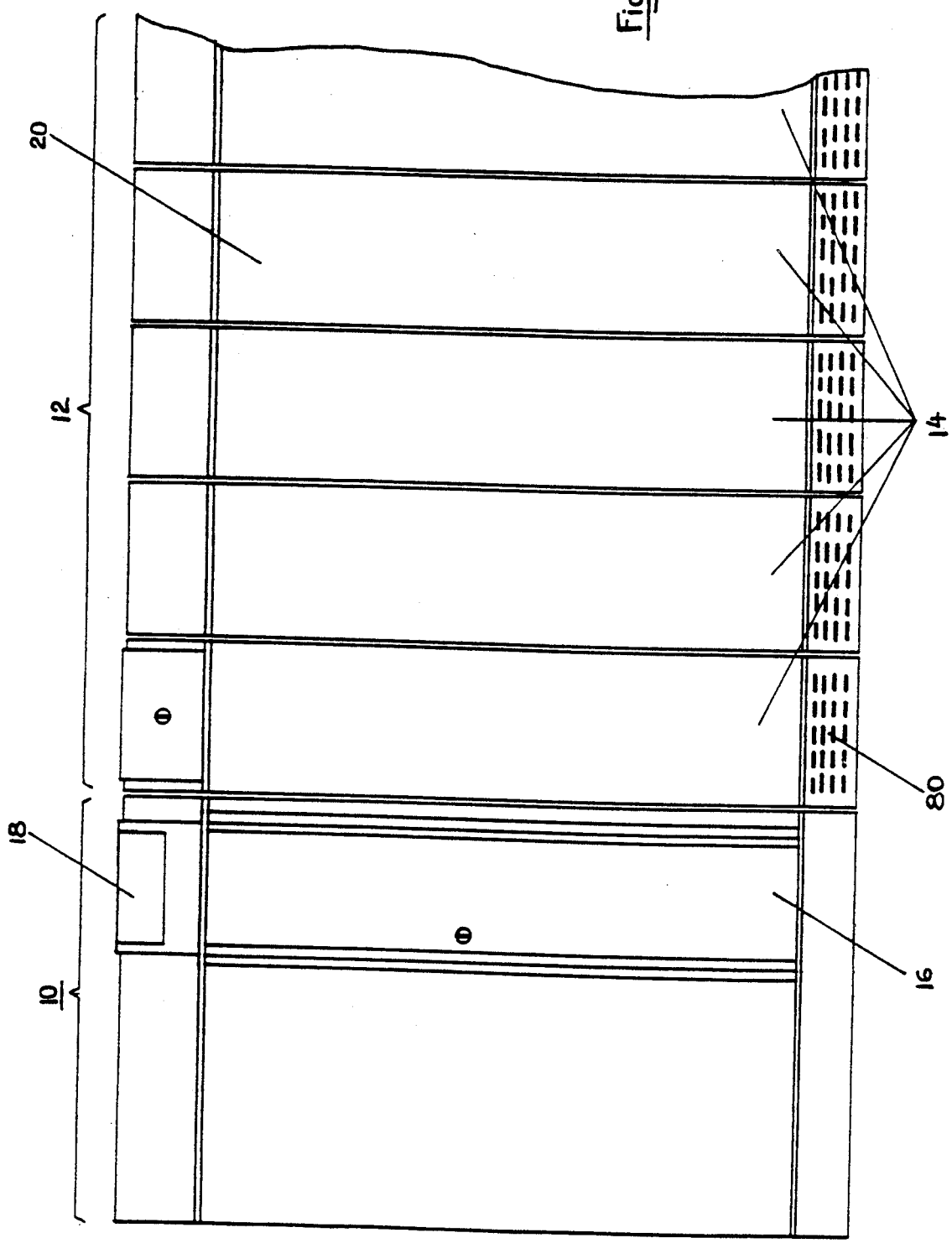
FIG. 1 shows an elevational view of an inverter cubicle associated with a modular battery bank cabinet.

In FIG. 1, side-by-side assembly of an inverter cubicle 10 and a supply formed by a modular cabinet 12 of several battery modules 14 is represented. The inverter cubicle 10, of the type described in U.S. Pat. No. 4,772,999 is equipped with an access door to the inside of the cubicle, and with a display console 18 with a control keyboard. Each battery module 14 of the cabinet 12 comprises its own external metal housing 20 (shown in detail in FIG. 7), but it is also possible to fit a housing common to several modules 14.

Figure 2:
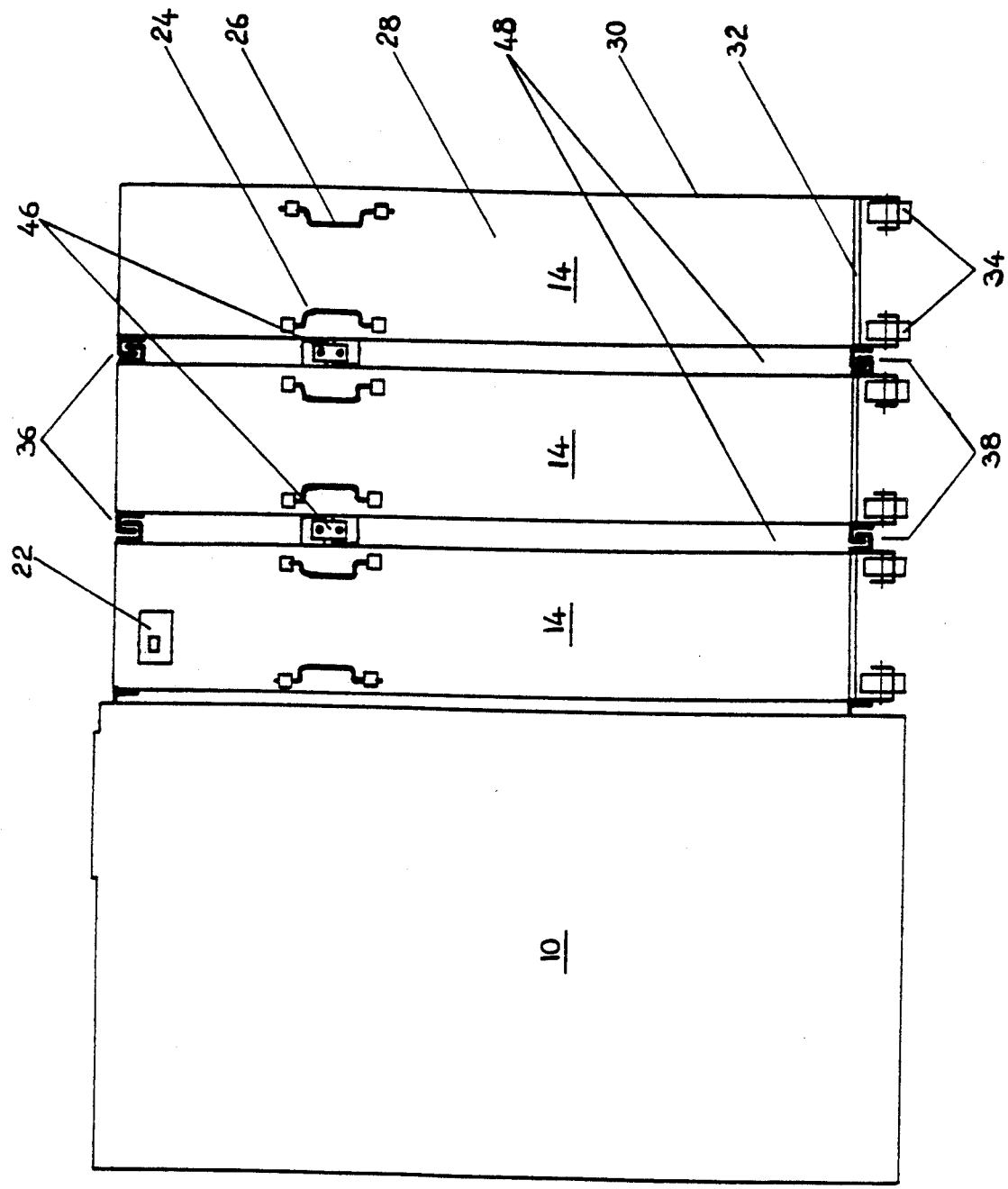
FIG. 2 is view identical to FIG. 1, after the external housing of the battery modules of the cabinet has been removed.

In FIG. 2 the modular cabinet 12 is composed of three battery modules 14, whose external housing 20 has been removed. The direct current supply is electrically connected to the inverter by a coupling circuit breaker 22, housed in the upper part of the first battery module 14 juxtaposed to the inverter cubicle 10. Each module 14 can be withdrawn from the cabinet 12 by means of a pair of fold-back handles 24, 26, located on the front flange 28 of the parallelipipedic-shaped frame 30. The plinth 32 of the frame 30 is fitted with four roller devices 34 allowing a reversible translation movement of the module 14 in the depthwise direction, i.e. in a plane perpendicular to FIG. 2. The roller devices 34, for example castors or roller-bars, are located at the four corners of the plinth 32, and bear directly on the floor or the ground. Handling of each battery module 14 is thus made easier for the user, due to the absence of any positioning trunking or rail in the ground.

Figure 3:
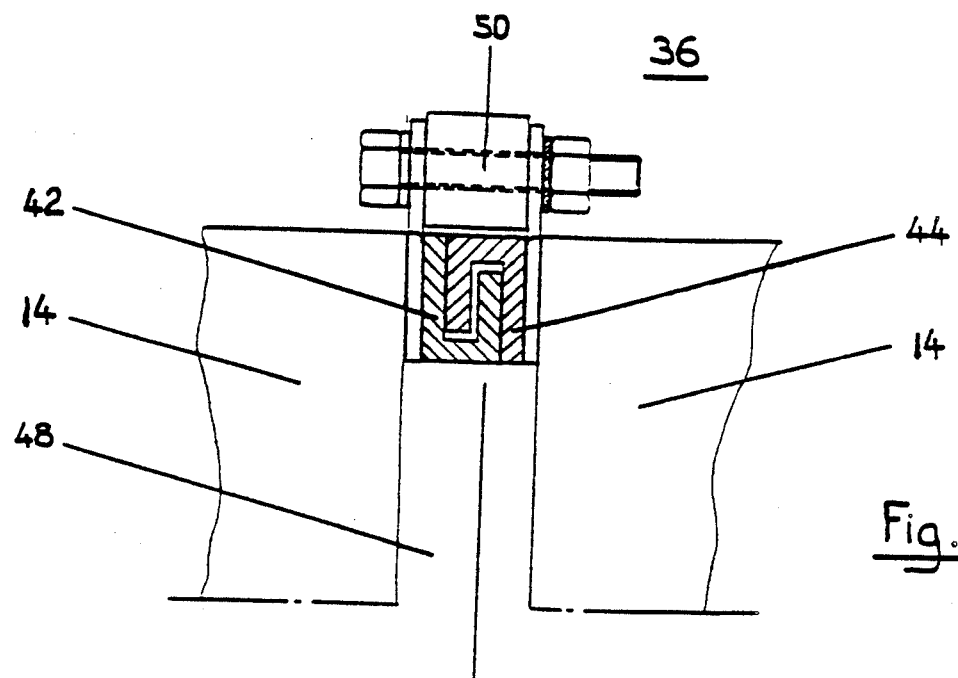
FIGS. 3 and 4 represent detailed views on an enlarged scale of FIG. 2, concerning respectively the upper and lower guiding devices of two adjoined modules.
Figure 4:
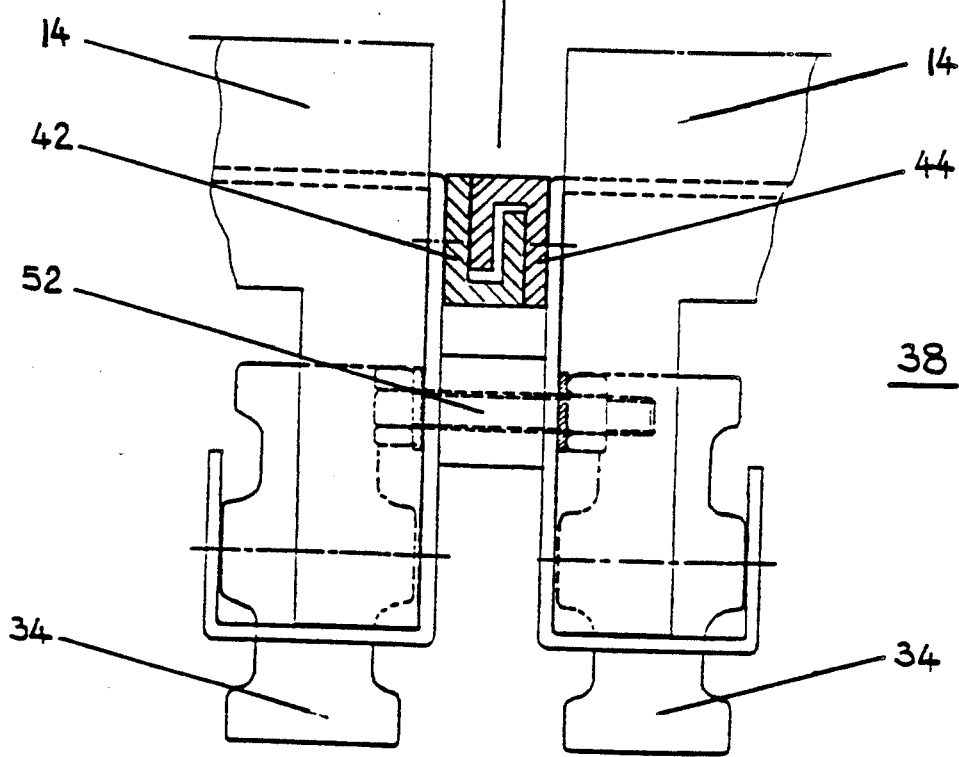

Relative translation movement between two juxtaposed modules 14 is achieved by means of a first and a second horizontal guiding device 36, 38, fitted at the top and bottom parts of the respective frames 30 (FIGS. 2 to 4). Each guiding device 36, 38 comprises as an example a double lateral slide 40 formed by imbrication of two U-shaped and reverse U-shaped sections 42, 44 fixed to the adjacent side walls of the frame 30 of the modules 14.

Mechanical locking of two module inserted in the cabinet is achieved by a retaining bolt 46 (FIG. 2), situated with the slides 40 of the two guiding devices 36, 38 in a transverse gap 48 separating two modules 14. The bolt 46 is withdrawn each time a module 14 is inserted or withdrawn.

Transporting a single-block assembly of two modules 14 requires a different mechanical anchoring, formed by two sets of nuts and bolts 50 (FIG. 3) and 52 (FIG. 4), disposed in the plane of the gap 48 respectively above and below the slides 40 of the two guiding devices 36, 38. The retaining bolt 46 is removed during transport, and replaced by the nuts and bolts 50, 52.

Figure 5:
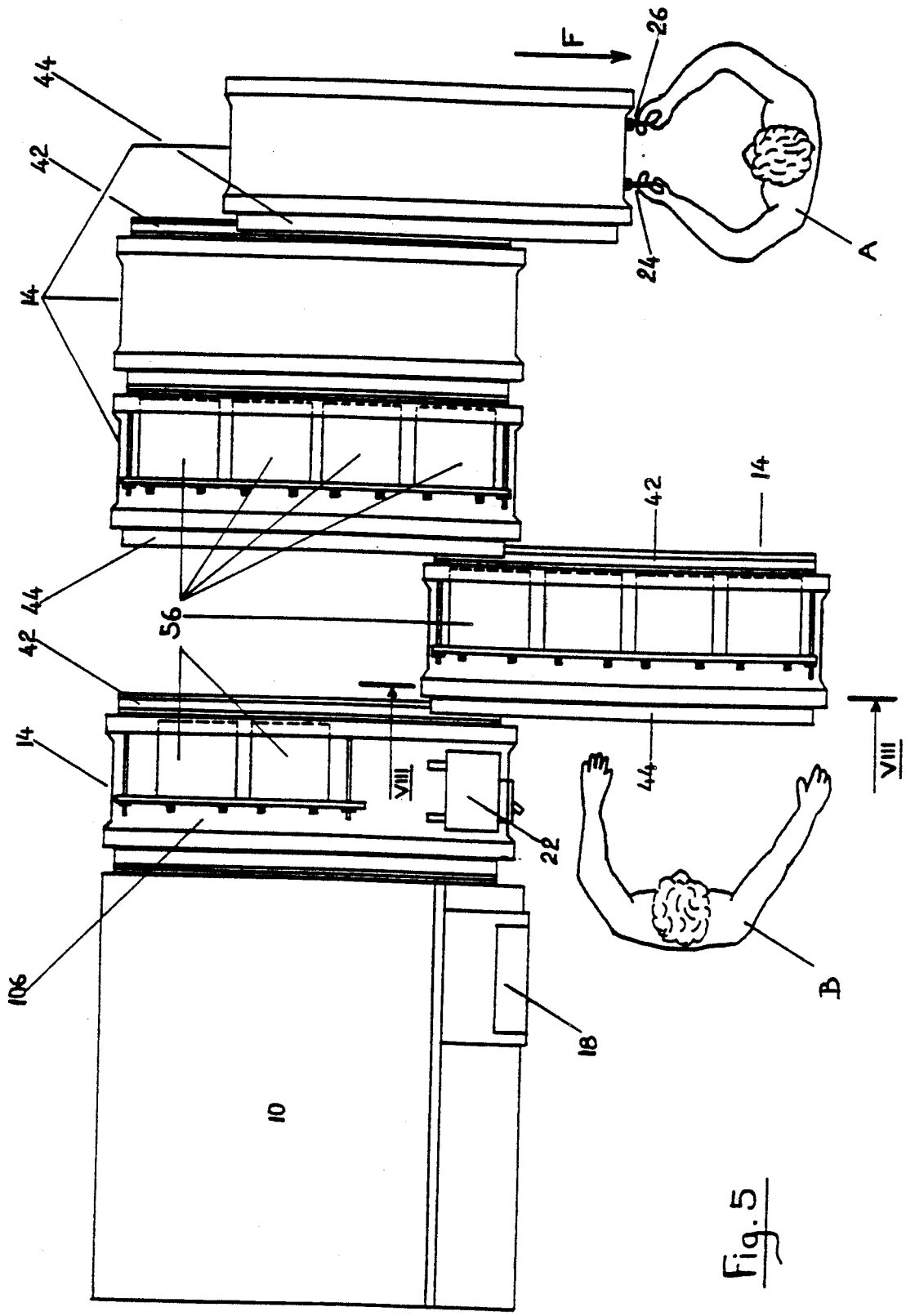
FIG. 5 is a plane view of FIG. 1 showing handling of the modules when a maintenance operation is performed, the roofs of the first three modules having been removed.

The plane view of the cabinet 12 (FIG. 5) with five battery modules 14 shows that the inverter cubicle 10 has the same depth as the associated battery modules 14. The roof 54 of the housing 20 of the first three modules 14 has been removed to be able to see the internal layout of the various batteries 56 of the top row. The user A represented on the right is withdrawing the fifth module 14 in the direction of the arrow "F", using the gripping handles 24, 26. Guiding in translation is achieved by cooperation of the first U-shaped section 42 securedly united to the right-hand side face of the fourth module 14, and of the second reverse U-shaped section 44 fixed to the left-hand side face of the fifth module 14. The user B on the left is examining all the batteries 56 housed in the second module 14 in the withdrawn position.

Figure 6:
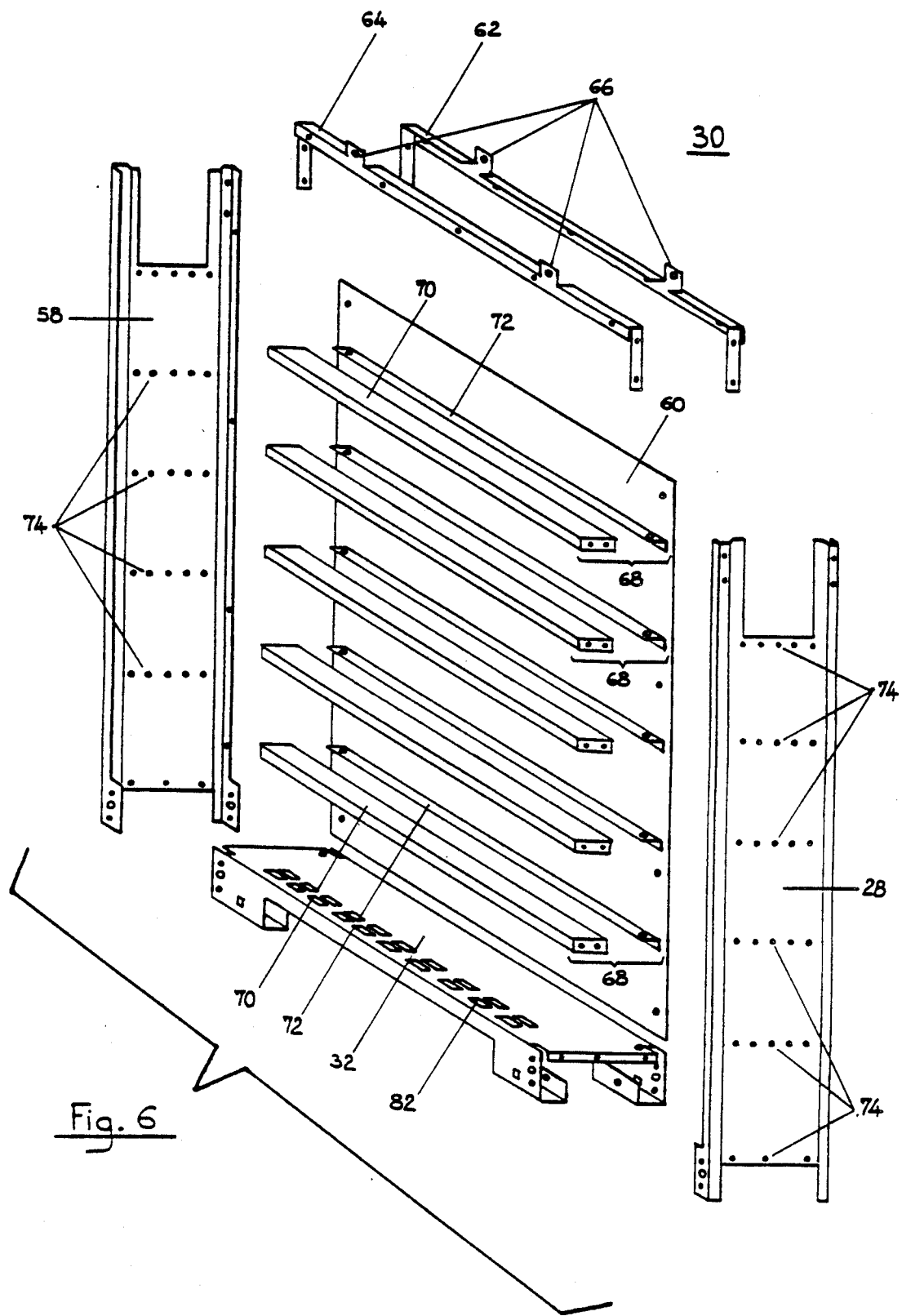
FIG. 6 is an exploded perspective view of the frame of a battery module.

In FIG. 6, the frame 30 of each module 14 comprises a parallelipipedic sheet metal framework, having in addition to the front flange 28 and the rectangular plinth 32, a rear flange 58 extending parallel to the front flange 28, and a closed side plate 60 located between the two flanges 28, 58 in a vertical plane perpendicular to the plinth 32. Opposite from the plinth 32, a pair of bars 62, 64 connects the flanges 28, 58 in a parallel direction to the side plate 60 to provide mechanical rigidity of the frame 30. Each horizontal bar 62, 64 is fitted with two lugs 66 to fix the sections 42, 44 belonging to the top guiding device 36. The other sections 42, 44 of the bottom guiding device 38 are fixed to the opposite side faces of the plinth 32. The distance between the two bars 62, 64 corresponds to the width of the plinth 32.

The frame 30 is equipped with a plurality of parallel shelves 68, fitted at regular intervals heightwise. Each shelf 68 is formed by the combination of a support plate 70 and a securing angle-bracket 72 arranged on the same horizontal plane. The support plates 70 are assembled by riveting or screwing to the front 28 and rear 58 flanges, whereas the angle-brackets 72 are fixed directly to the side plate 60. The presence of adjusting orifices 74 in the flanges 28, 58 enables the lateral position of the support plates 70 to be adjusted to adapt the surface of each shelf 68 to the dimensions of the batteries 56.

Figure 7:
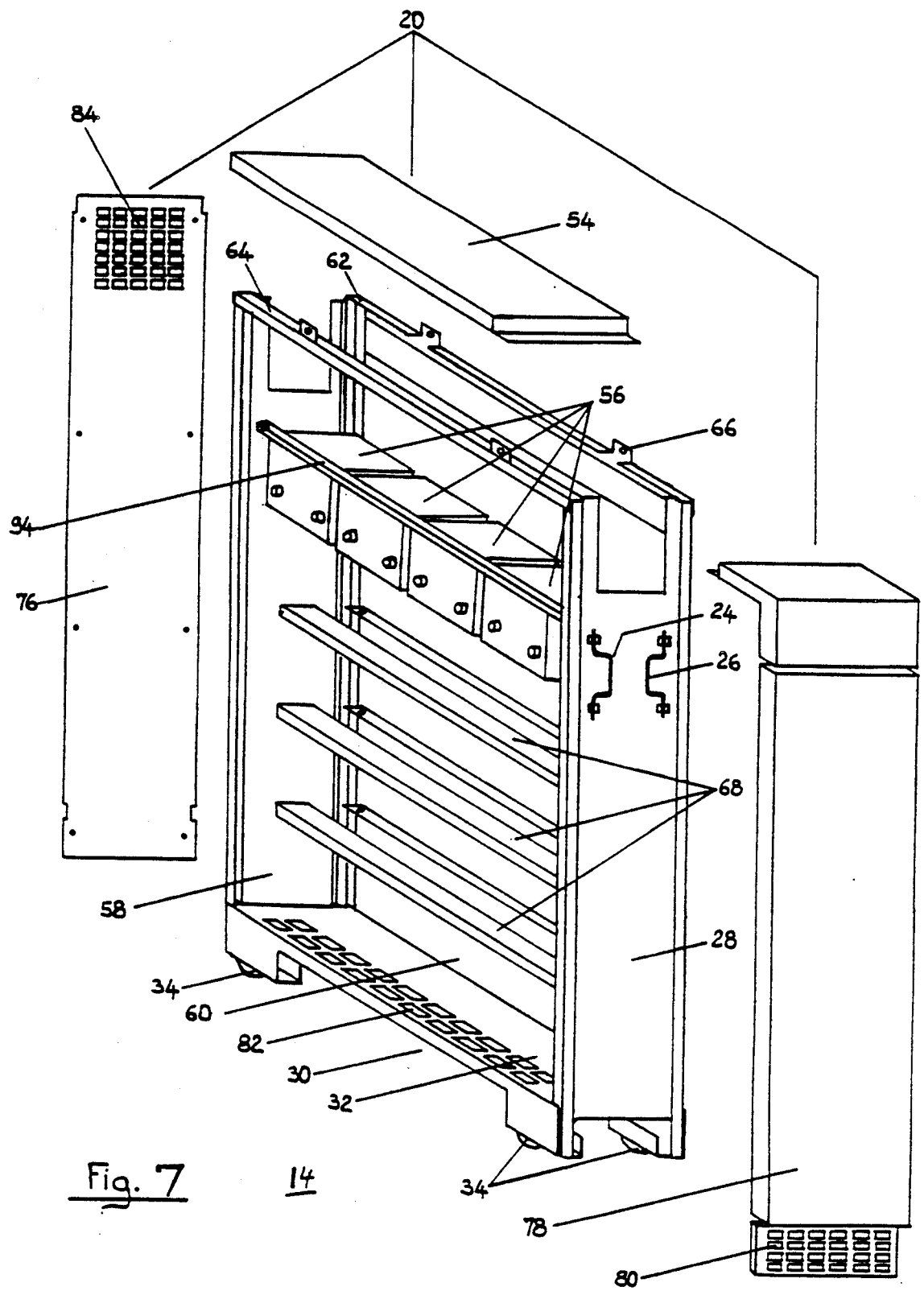
FIG. 7 is a perspective view of a module showing the frame assembled ready to receive the batteries and the external housing.

In FIG. 7, the finished frame 30 of a battery module 14 is shown after assembly by screwing or riveting of the assembly comprising the side plate 60, flanges 28, 58, plinth 32 and upper bars 62, 64. The frame 30 is then ready to receive the external metal housing 20, after the batteries 56 have been installed on the various horizontal shelves 68. The housing 20 of the frame 30 comprises the roof 54 designed to be fitted on the top bars 62, 64, a rear plate 76 and a front plate 78 capable of respectively covering the external surface of the flanges 58, 28.

The inside of a module 14 is ventilated via various grates 80, 82, 84 judiciously positioned to ensure that cooling air will flow through the module by a chimney effect. Forced ventilation can also be envisaged depending on the environmental criteria, and on the capacity of the battery bank. The inlet grates 80, 82 are arranged in the lower part of the module 14, respectively in the front plate 78 and in the plinth 32, whereas the outlet grate 84 is located in the upper part of the module 14, for example in the rear plate 76 of the housing 20 (FIG. 7).

Referring to FIGS. 8 to 10, the various batteries 56 are arranged side by side in fours on each horizontal shelf 68. A larger or smaller number of batteries 56 can be chosen in each row depending on their size and type. In the case of sealed maintenance-free batteries 56, the configuration of the module 14 makes it possible to envisage a position lying on their sides, in which the cover bearing the two positive and negative polarity terminals 86, 88 of each battery 56 is facing the open side face 90 of the frame 30. Opposite from the terminals 86, 88, the base of the battery 56 is facing the side plate 60 of the frame 30. In each row, the batteries 56 are lying on one of their side walls on the corresponding shelf 68, so that the different terminals 86, 88 are aligned in a parallel direction to the shelf 68.

The four batteries 56 of any one row are held in place by a mechanical locking device 92 comprising a retaining spacer 94 cooperating at its opposite ends with two fixing stays 96, 98 extending in an oblique direction. The horizontal bracket-shaped spacer 94 bears on the top front edge of each battery 56. One curved end 100 of each stay 96, 98 is fitted in a hole of the angle-bracket 72 of the shelf 68, whereas the other end 102 is threaded to accommodate a tightening nut 104 (FIG. 10). The end 102 passes through the spacer 94, and the nut 104 bears on the spacer 94.

A transverse space 106 is arranged between the batteries 56 and the open side face 90 over the whole height of the module 14. This space 106 creates a free vertical volume, which enables the different batteries 56 to be interconnected in series or parallel, and improves the ventilation inside the module 14.

In the withdrawn position of a module 14, the user B (FIG. 5) can see all the batteries 56, as represented in FIG. 8, through the open face 90. This results in the terminals 86, 88 and connections 106 being fully accessible (see second row), which makes assembly, insertion and maintenance operations easier. The electrical wiring between the batteries 56 of the different rows is achieved in a standard, modular manner.

According to an alternative embodiment, the batteries 56, instead of being on their sides, can be placed upright, with their respective bases standing on the shelves 68.

We claim:

1. A modular cabinet for electrical battery banks, comprising a plurality of parallely arranged longitudinal battery modules, each of said modules having a frame comprising:

a rectangular plinth;

rolling means disposed on a bottom surface of said rectangular plinth for providing movement of the battery modules between a stored position within the modular cabinet and a withdrawn position;

a vertical front flange extending in a direction perpendicular to said plinth;

a vertical rear flange arranged parallel to said vertical front flange;

a plurality of horizontal shelves interposed between said vertical front flange and said vertical rear flange;

a side plate connecting the flanges and the rectangular plinth, thereby closing one side of the module; and lateral guiding means for (i) mechanically coupling adjacent modules, or a single module to a structure arranged adjacent said modular cabinet, when said modules are in said stored position, and (ii) guiding said modules during withdrawal thereof from the modular cabinet;

wherein a plurality of batteries are arranged on each of said horizontal shelves such that a transverse free space is provided between the batteries and an open side, opposing the closed side, of each said module, and said batteries are fully accessible via said open side when at least one module is in said withdrawn position.

2. The modular cabinet of claim 1, wherein said lateral guiding means comprise a first section and a second parallel section of conjugate shape, and cooperation of the first section of one of the modules with the second section of an adjacent module or a structure arranged adjacent said one of the modules constitutes a slide disposed in a transverse gap separating the two modules or said one of the modules and said structure.

3. The modular cabinet of claim 1, wherein the batteries are placed on their sides on the shelves in a side-by-side manner, and the two terminals of each battery are arranged facing the open side of the module.

4. The modular cabinet of claim 1, wherein the batteries are placed upright on the shelves with their bases standing on the shelves.

5. The modular cabinet of claim 3, wherein each module comprises air inlet and outlet grates which allow internal ventilation of the modules via a vertical volume of said transverse free space.

6. The modular cabinet of claim 1, wherein the vertical front flange of each said frame includes gripping handles fixed thereto for facilitating handling of each respective module.

7. The modular cabinet of claim 1, wherein the batteries arranged on any one shelf are held in place by a mechanical locking device comprising a retaining spacer cooperating at its opposite ends with two oblique stays.

8. The modular cabinet of claim 1, wherein each shelf comprises a support plate securely united via opposed ends thereof to the front and rear flanges, and a securing angle-bracket fixed to the side plate in the same horizontal plane as each said shelf.

9. The modular cabinet of claim 7, wherein each front and rear flange is provided with orifices formed therein to adjust the lateral position of the corresponding support plate joined thereto, to adapt the surface of each respective shelf to the dimensions of the batteries.

10. The modular cabinet of claim 2, wherein mechanical locking of adjacent modules is achieved by either a retaining bolt located in the transverse gap therebetween, or by a system of nuts and bolts.

* * * * *